United States Patent [19]
Wu

[11] Patent Number: 5,885,873
[45] Date of Patent: Mar. 23, 1999

[54] DOUBLE CODING PROCESSES FOR MASK READ ONLY MEMORY (ROM) DEVICES

[75] Inventor: Shye-Lin Wu, Hsinchu, Taiwan

[73] Assignee: Texas Instruments—Acer Incorporated, Hsinchu, Taiwan

[21] Appl. No.: 63,211

[22] Filed: Apr. 20, 1998

[51] Int. Cl.[6] .............................................. H01L 21/8236
[52] U.S. Cl. ........................................ 438/276; 438/278
[58] Field of Search .................................. 438/275, 276, 438/277, 278

[56] References Cited

U.S. PATENT DOCUMENTS

| | | | |
|---|---|---|---|
| 4,233,671 | 11/1980 | Gerzberg et al. | 438/275 |
| 4,898,838 | 2/1990 | Morris et al. | 437/31 |
| 5,786,252 | 7/1998 | Ludikhuize et al. | 438/275 |

Primary Examiner—Joni Chang
Attorney, Agent, or Firm—Harness, Dickey & Pierce, P.L.C.

[57] ABSTRACT

The present invention includes forming a thin oxide layer and a polysilicon layer on a substrate. A thin silicon nitride layer is then formed on the polysilicon layer. An etching is performed to etch back the silicon nitride layer and the polysilicon layer on a NMOS cell region. Next, a blanket ion implantation is carried out to form lightly doped drain regions. A coding oxide layer is formed on the NMOS cell region. Then, the silicon nitride layer is stripped. A second polysilicon layer is successively deposited over the substrate. The polysilicon layer, the gate oxide layer and the coding oxide layer are patterned to form the gate structures. A second ion implantation is used to implant ions to form LDD regions. Side wall spacers are then formed on the side walls of the gate structures. Next, a third ion implantation is then carried out to dope ions into the substrate thereby forming source and drain regions. A high temperature thermal anneal is performed to activate the dopant.

16 Claims, 6 Drawing Sheets

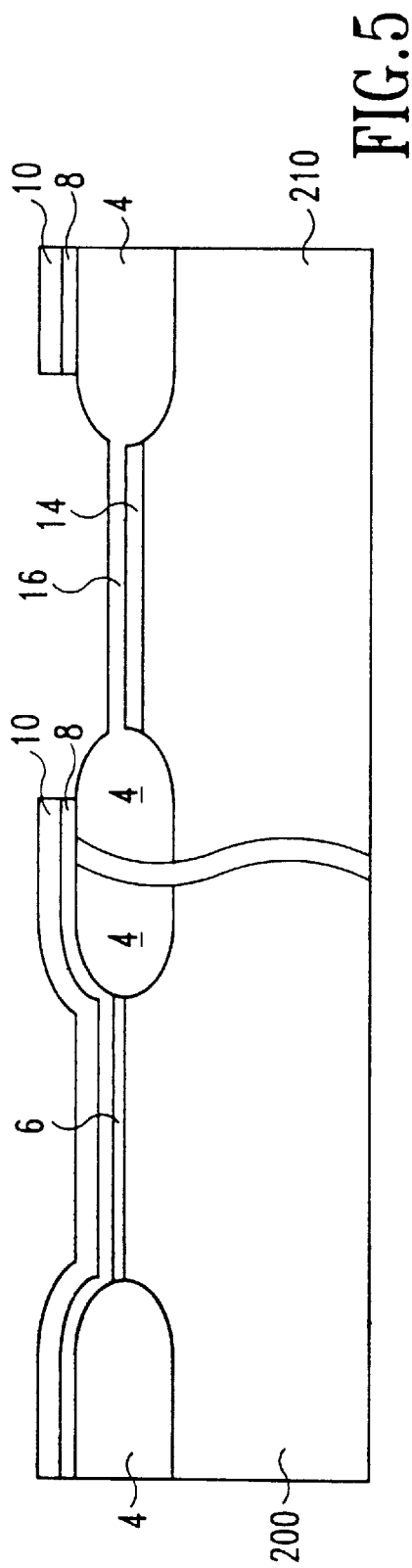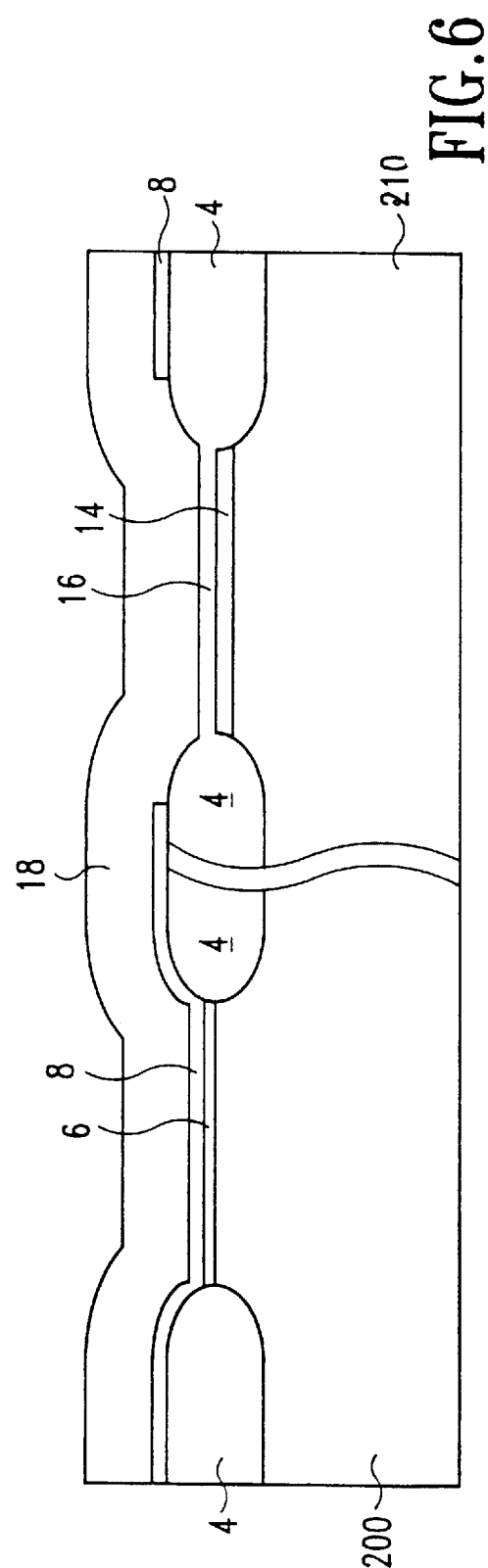

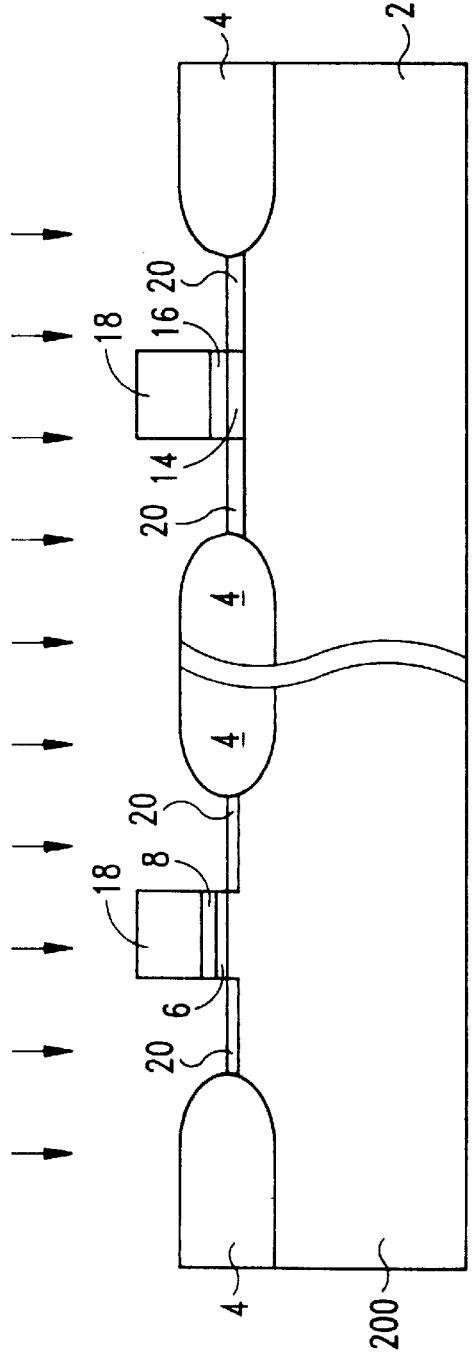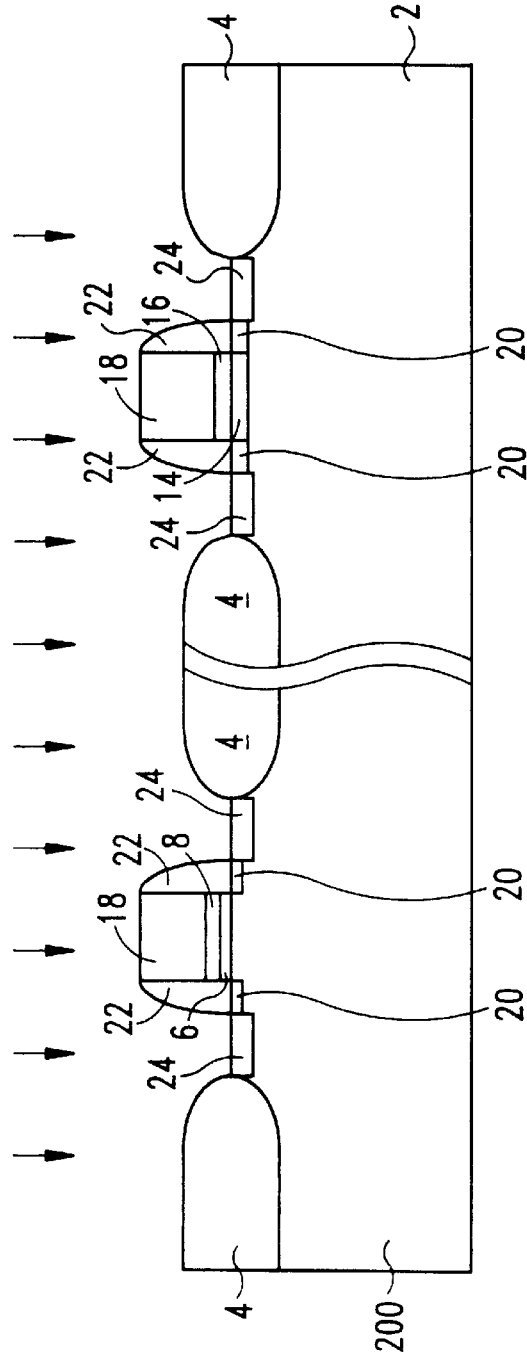

DOUBLE CODING PROCESSES FOR MASK READ ONLY MEMORY (ROM) DEVICES

FIELD OF THE INVENTION

The present invention relates to semiconductor devices, specifically to semiconductor memories and more specifically to a method of forming mask read only memories by using double coding processes.

BACKGROUND

The memory devices are driven by the new application and the requirement of the future. The advance in the field of computer and communications will use large quantities of each species of memories. For example, computer interfaces will become to be operated by speech processing or vision processing, and other communication interfaces, all of which require a lot of memories. Memory technology will continue to move in the direction of increased numbers of devices in a wafer. Read only memory (ROM) devices include ROM cells for coding data and a periphery controlling devices to control the operation of the cells. Each bit of data is stored in a cell, which is a single n-channel transistor or ROM cell. As well known in the art, the programming of the ROM is executed by controlling a threshold voltage of the MOS transistors constructing the memory cell by the implantation of dopant.

In general, mask ROM includes devices with difference threshold voltages. A type of device is formed in an active area and another type of device with a threshold voltage mask formed in another active area during the process. In MOS transistors for mask ROM, the threshold voltages of the channel regions under the gates are set to the same before data writing. Thereafter, ions are selectively implanted into determined regions to differentiate the threshold voltages thereof for data writing. One of the methods that involves differentiating the threshold voltages is achieved by ion implantation of some of the transistor gates. This method raises the threshold voltage of the n-channel device by doping boron with heavy dose. The prior arts relating to the ROM can be seen in U.S. Pat. No. 5,372,961 and U.S. Pat. No. 5,538,906 disclosed by Noda and Aoki, respectively. The process of ion implantation having high dose boron through the sacrifice oxide or the polysilicon gate into the substrate is widely used to fabricate the normally off mask ROM devices.

However, the high dose boron implantation results in a lower junction breakdown voltage of the coded MOS and more importantly to a very high leakage current between the adjacent bit lines. As mentioned in a U.S. Pat. No. 5,597,753 disclosed by Sheu, the high leakage current results in very high standby current. Another problem occurs with the ROM code implantation. As known in the art, after the code implantation is carried out, a thermal process is used to activate the implanted dopant which will cause counter doping of the adjacent bit lines, thereby increasing the bit line resistance and substantially degrading the performance of the ROM devices. One prior art to reduce the bit line resistance is disclosed by Hong in U. S. Pat. No. 5,571,739.

SUMMARY

The present invention discloses a method to form ROM devices with double coding processes. The object of the present invention is to solve the problems mentioned above. The steps of the method can be seen as follows. A thin oxide layer is formed both on a normal NMOS device region and a NMOS cell region. A polysilicon layer is deposited by chemical vapor deposition on the gate oxide layer. A thin silicon nitride layer is then formed on the polysilicon layer. A photoresist is patterned over the normal NMOS device region to expose the NMOS cell region. An etching is performed by using the photoresist as an etching mask to etch back the silicon nitride layer and the polysilicon layer on the NMOS cell region. Next, the photoresist is removed. Next, a blanket ion implantation with p type conductive dopant is carried out to form lightly doped drain regions. A coding oxide layer is formed on the NMOS cell region by a thermal oxidation in an ambient containing oxygen. In the preferred embodiment, the thickness of the coding oxide layer is thicker than the one of the initial gate oxide layer. Then, the silicon nitride layer is stripped. A second polysilicon layer is successively deposited over the substrate.

The polysilicon layer, the gate oxide layer and the coding oxide layer are patterned to form the gate structures on the aforementioned normally NMOS device region and the NMOS cell region, respectively. A second ion implantation is used to implant ions to form n type LDD regions. Side wall spacers are then formed on the side walls of the gate structures. Next, a third ion implantation is then carried out to dope ions into the substrate thereby forming n conductive type source and drain regions adjacent to the gate structure in the NMOS device region and NMOS cell region, respectively. A high temperature thermal anneal is performed to activate the dopant and therefore forming shallow junction of the devices.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 5 is a cross sectional view of a semiconductor substrate illustrating the step of forming a coding oxide layer over the substrate according to the present invention.

FIG. 6 is a cross sectional view of a semiconductor substrate illustrating the step of forming a second polysilicon layer on the substrate according to the present invention.

FIG. 7 is a cross sectional view of a semiconductor substrate illustrating the step of performing a second ion implantation according to the present invention.

FIG. 8 is a cross sectional view of a semiconductor substrate illustrating the steps of forming spacers and performing a third ion implantation according to the present invention.

DETAILED DESCRIPTION

Figure 1:
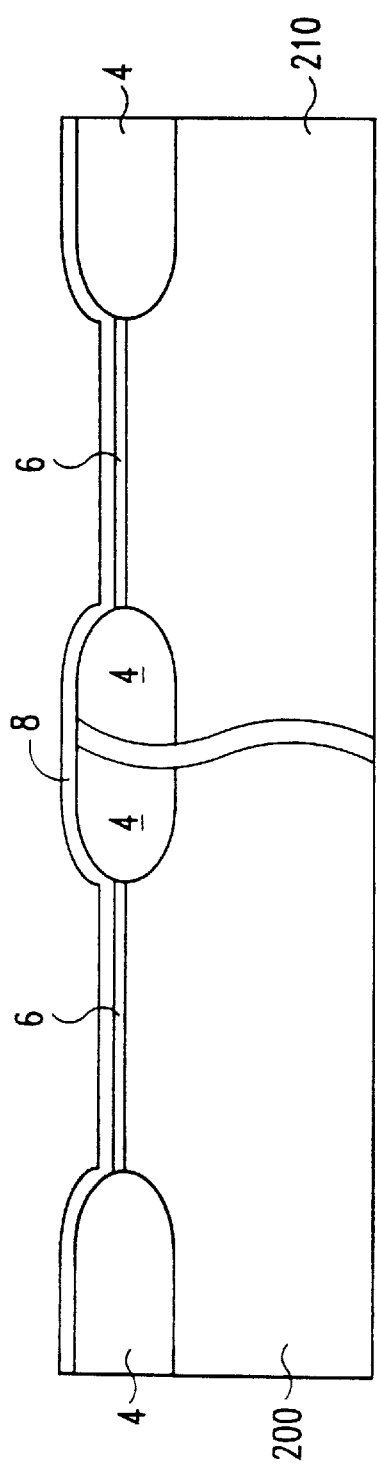
FIG. 1 is a cross sectional view of a semiconductor substrate illustrating the steps of performing a gate oxide layer and a polysilicon layer on the substrate according to the present invention.

The present invention proposes a method with double coding processes to fabricate normally off mask ROM devices. With the processes according to the present invention, the disadvantage mentioned in the background will be eliminated. The high dose coding implant induced counter doping of the adjacent bit lines can be minimized. The detailed description can be seen as follows. Referring to FIG. 1, a single crystal substrate with a <100> crystallographic orientation is used for the preferred embodiment. The substrate is divided into two major portions that are a normal NMOS device region 200 and a NMOS cell region 210 for coding. In this embodiment, thick field oxide (FOX) regions 4 are created for the purposes of isolation. Typically, the FOX regions 4 are created via a photoresist and dry etching to define a silicon nitride-silicon dioxide composite layer. After the photoresist is removed and wet clean process, thermal oxidation in an oxygen ambient is performed using the composite layer as a hard mask to form the FOX regions 4, to a thickness of about 3000–8000 angstroms. The silicon nitride layer is then typically removed using hot phosphoric acid solution while the silicon dioxide is removed by using diluted HF or BOE solution. Other technology such as trench isolation may be used.

Subsequently, a thin oxide layer 6 is formed both on the normal NMOS device region 200 and the NMOS cell region 210 to act as a gate oxide by using an oxygen-steam ambient, at a temperature between about 800 to 1100 degrees centigrade. Alternatively, the gate oxide 6 may be formed by using other known oxide chemical compositions and procedures. For example, the gate oxide layer 6 can be silicon dioxide formed using a chemical vapor deposition process, with a tetraethylorthosilicate (TEOS) source, at a temperature between about 600 to 800 degrees centigrade and a pressure of about 0.1 to 10 torr. In the preferred embodiment, the thickness of the gate oxide layer 6 is about 15–200 angstroms. After the silicon oxide layer 6 is formed. A polysilicon layer 8 is deposited by chemical vapor deposition on the gate oxide layer 6.

Figure 2:
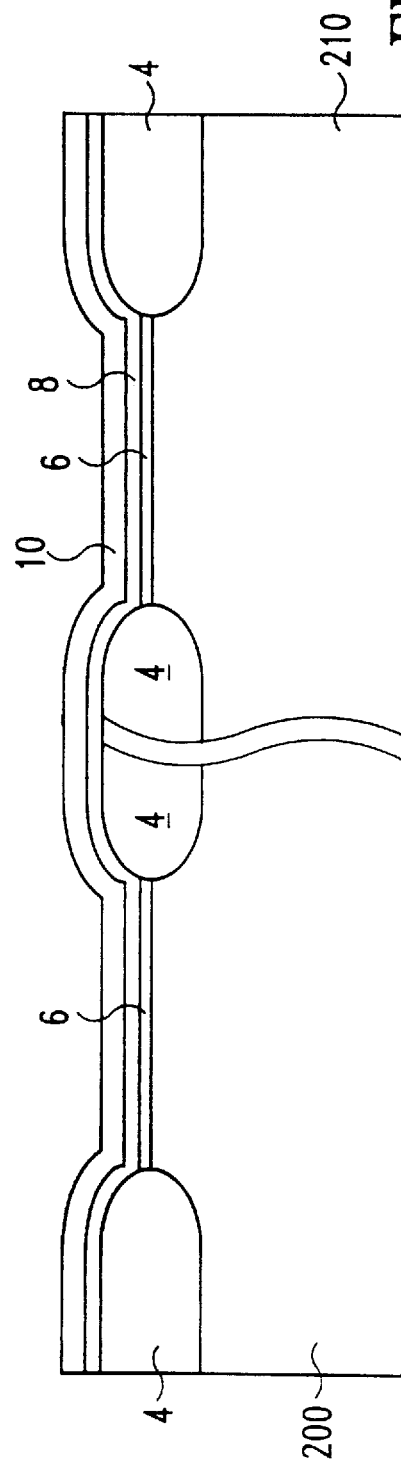
FIG. 2 is a cross sectional view of a semiconductor substrate illustrating the step of forming a silicon nitride layer over substrate according to the present invention.

Turning to FIG. 2, a thin silicon nitride layer 10 is then formed on the polysilicon layer 8. In general, the silicon nitride layer 10 can be deposited by any suitable process such as Low Pressure Chemical Vapor Deposition (LPCVD), Plasma Enhance Chemical Vapor Deposition (PECVD), Electron Cyclotron Remote Chemical Vapor Deposition (ECRCVD). The thickness of the silicon nitride layer is about 200 to 1500 angstroms. Further, the temperature to form the silicon nitride layer 10 is at a range about 300°–800° C. In the preferred embodiment, the reaction gases of forming the silicon nitride layer 10 are selected from $SiH_4$, $NH_3$, $N_2$, $N_2O$ or $SiH_2Cl_2$, $NH_3$, $N_2$, $N_2O$.

Figure 3:
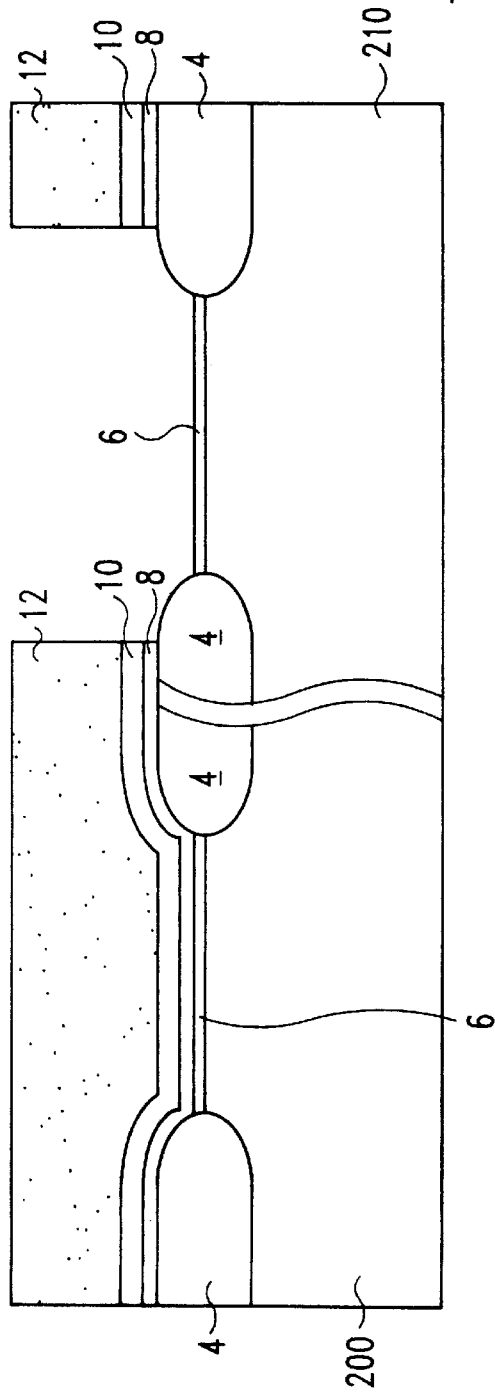
FIG. 3 is a cross sectional view of a semiconductor substrate illustrating the step of patterning a photoresist on the substrate according to the present invention.

Now referring to FIG. 3, a photoresist 12 is patterned over the normal NMOS device region 200 to expose the NMOS cell region 210 by means of conventional lithography process. Afterwards, an etching is performed by using the photoresist 12 as an etching mask to etch back the silicon nitride layer 10 and the polysilicon layer 8 on the NMOS cell region 210. Next, the photoresist 12 is removed by the technology well known in the art.

Figure 4:
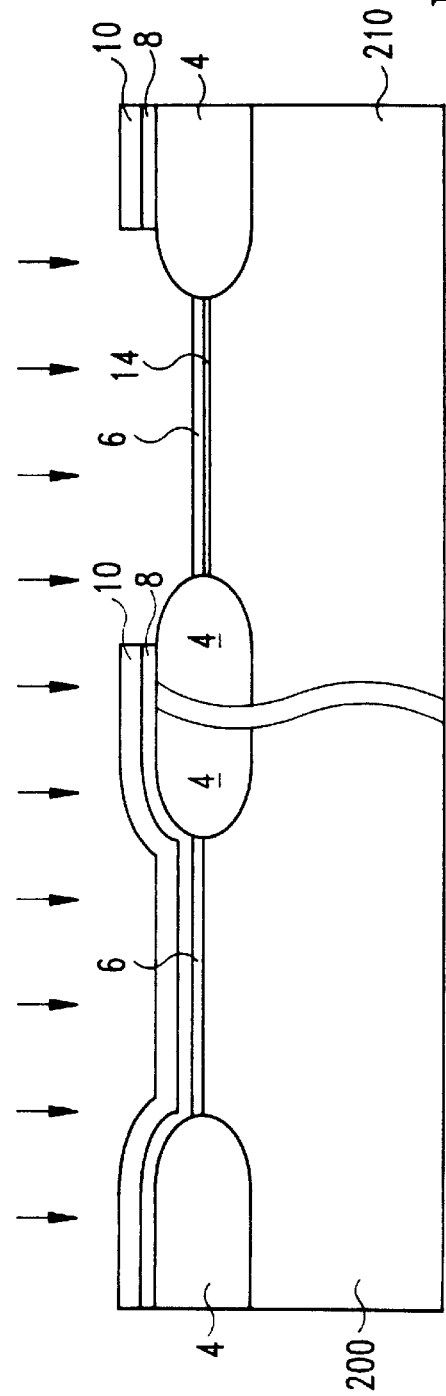
FIG. 4 is a cross sectional view of a semiconductor substrate illustrating the step of performing a first ion implantation according to the present invention.

Next, a blanket ion implantation with p type conductive dopant such as $BF_2$ or boron is carried out to form p type lightly doped drain regions 14 adjacent to the surface of the NMOS cell region 210, as shown in FIG. 4. The implantation is performed with low dose to increase the surface boron concentration for coding. Preferably, the energy and dosage of the implantation are about 5 to 120 KeV, 5E12 to 5E14 atoms/cm², respectively.

Turning to FIG. 5, a coding oxide layer 16 is formed on the NMOS cell region 210 by a thermal oxidation in an ambient containing oxygen. The silicon nitride layer 10 serves as a hard mask during the oxidation. The temperature for the thermal oxidation is about 750 to 1100 degrees centigrade. In the preferred embodiment, the thickness of the coding oxide layer 16 is about 200 to 800 angstrom that is thicker than the one of the initial gate oxide layer 6. Then, the silicon nitride layer 10 is stripped by using wet etching such as hot phosphorus solution. A second polysilicon layer 18 is successively deposited over both the normally NMOS device region 210 and the NMOS cell region 210, as shown in FIG. 6. In the step, the second polysilicon layer 18 is used to act as a word line.

Referring to FIG. 7, the polysilicon layers 8 and 18, the gate oxide layer 6 and the coding oxide layer 16 are patterned to form the gate structures on the aforementioned normally NMOS device region 200 and the NMOS cell region 210, respectively. A second ion implantation with n conductive type dopant is used to implant ions into the NMOS device region 200 and the NMOS cell region 210 by using the gate structures as a mask, thereby forming n type LDD regions 20 adjacent to the gate structures. Preferably, the dopant for the second ion implantation is phosphorus or arsenic and the implantation is performed with low dosage. The energy and dosage of the implantation are about 5 to 100 KeV, 1E12 to 1E14 atoms/cm², respectively.

Referring to FIG. 8, an oxide layer is deposited by means of chemical vapor deposition on the gate structures. Side wall spacers 22 are then formed on the side walls of the gate structures by an anisotropically etching back the oxide layer. Next, a third ion implantation is then carried out to dope ions into the substrate. In the preferred embodiment, the step is employed with high dose n conductive type ions, such as arsenic or phosphorus. After the procedure, n conductive type source and drain regions 24 are formed adjacent to the gate structure in the NMOS device region 200 and NMOS cell region 210, respectively. It has to be note that the concentration of the NMOS cell will be lower than the one of the normal NMOS device due to the first ion implantation is introduced with p type conductive dopant. The NMOS cell region 210 exhibit high resistance. Thus, the threshold voltage of the NMOS cell region 210 will much higher than that of the normal device in the NMOS device region 200. The energy and dosage of the forth implantation are about 0.5 to 80 KeV, 5E14 to 5E16 atoms/cm², respectively.

Figure 9:
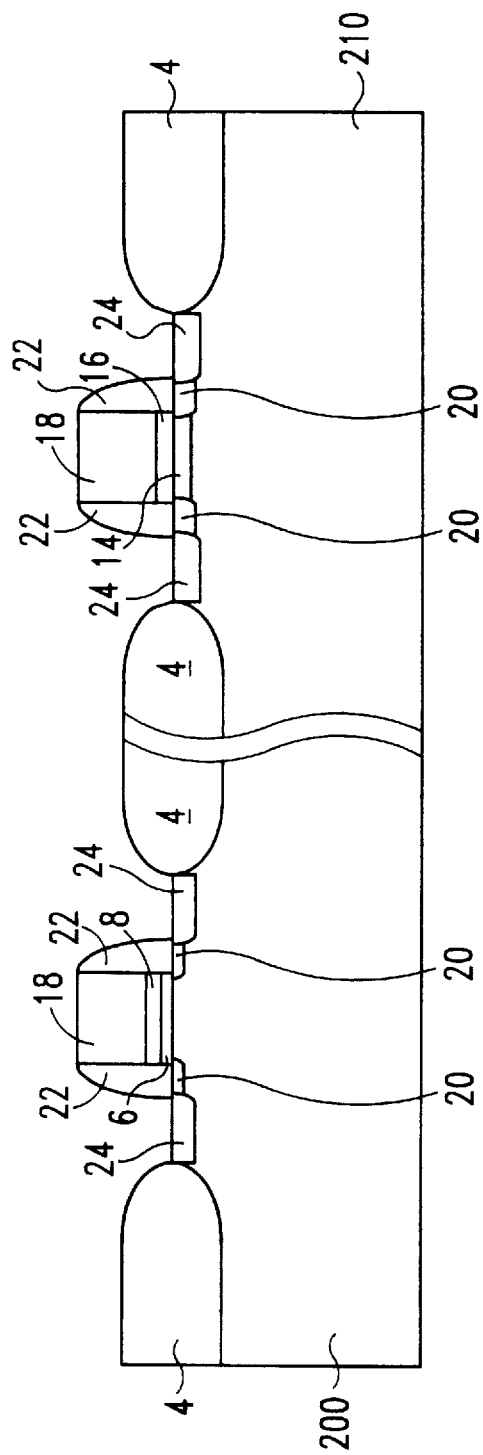
FIG. 9 is a cross sectional view of a semiconductor substrate illustrating the step of performing a thermal oxidation to activate the dopant according to the present invention.

Turning to FIG. 9, a high temperature thermal anneal is performed in an ambient containing the gas that is selected from the group of $N_2$, $O_2$, and $N_2O$ to activate the dopant and therefore forming shallow junction of the devices. In a case, the temperature for this step can range from 800 to 1100 degrees centigrade.

TABLE 1 compares the threshold voltage of various coding process. The coding implant is performed with $BF_2$ by using 100 KeV through pad oxide having 250 angstroms in thickness.

TABLE 1

| sample | coding implant (atoms/cm$^2$) | coding oxide (angstrom) | threshold voltage (V) |
|---|---|---|---|
| A | no | no | 0.69 |
| B | 1E14 | no | 2.81 |
| C | 1E14 | 300 | 7.41 |
| D | no | 300 | 1.84 |
| E | 5E14 | no | 3.95 |
| F | 5E13 | 300 | 6.16 |

Figure 10:
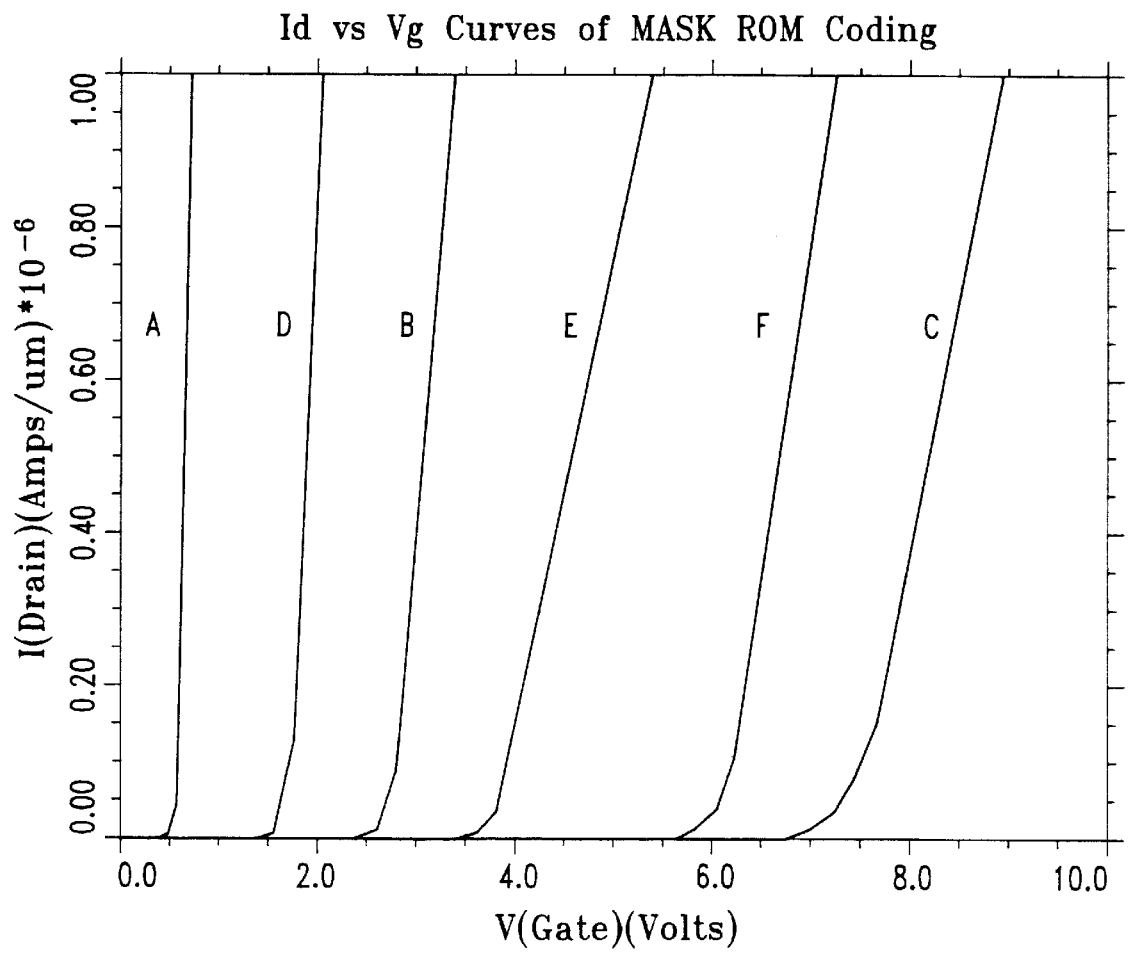
FIG. 10 shows the Id versus Vg curves of difference coding conditions.

FIG. 10 shows the Id versus Vg curves of difference coding conditions. It can be seen that the combination of low dose boron implant and thicker gate oxide film exhibits a better candidate for the normally off mask ROM operation. As can be appreciated from the above disclosure, the present invention provides the following advantages: (1) the high dose coding implant induced a lower junction breakdown and a higher leakage current of the coded NMOS device can be avoided by using a low dose boron or BF$_2$ coding implant. (2) the high dose coding implant induced counter doping of the adjacent bit lines can be minimized (3) the gate oxide thickness of the proposed coded NMOS devices is much thinner than that of the thick oxide coded NMOS cell.

As is understood by a person skilled in the art, the foregoing embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

What claimed is claimed:

1. A method for manufacturing a mask ROM (read only memory) device on a semiconductor substrate having a NMOS device region and a NMOS cell region for coding, said method comprising:

forming a gate oxide layer on said semiconductor substrate;

forming a first polysilicon layer on said gate oxide layer;

forming a nitride layer on said first polysilicon layer;

patterning a photoresist on said NMOS device region to expose said NMOS cell region;

etching said first polysilicon layer and said nitride layer on said NMOS cell region;

removing said photoresist;

performing a first ion implantation for coding implant to increase a dopant concentration in said NMOS cell region;

forming a coding oxide layer on said NMOS cell region;

removing said nitride layer;

forming a second polysilicon layer over said semiconductor substrate;

forming gate structures on said NMOS device region and said NMOS cell region;

performing a second ion implantation to form LDD structures in said semiconductor substrate adjacent to said gate structures;

forming spacers on side walls of said gate structures;

performing a third ion implantation to form source and drain regions in said semiconductor substrate adjacent to said LDD structures;

removing said second photoresist; and performing a thermal anneal to activate a dopant in said semiconductor substrate.

2. The method of claim 1, wherein a dopant of said first ion implantation is selected from a group consisting of boron and BF$_2$.

3. The method of claim 1, wherein an energy of said first ion implantation is about 5 to 120 KeV.

4. The method of claim 1, wherein a dosage of said first ion implantation is about 5E12 to 5E14 atoms/cm$^2$.

5. The method of claim 1, wherein a dopant of said second ion implantation is selected from a group consisting of phosphorus and arsenic.

6. The method of claim 1, wherein an energy of said second ion implantation is about 5 to 100 KeV.

7. The method of claim 1, wherein a dosage of said second ion implantation is about 1E12 to 1E14 atoms/cm$^2$.

8. The method of claim 1, wherein a dopant of said third ion implantation is selected from a group consisting of phosphorus and arsenic.

9. The method of claim 1, wherein an energy of said third ion implantation is about 0.5 to 80 KeV.

10. The method of claim 1, wherein a dosage of said third ion implantation is about 5E14 to 5E16 atoms/cm$^2$.

11. The method of claim 1, wherein said coding oxide layer is formed by a thermal oxidation.

12. The method of claim 1, wherein said nitride layer is removed by using hot phosphorus solution.

13. The method of claim 1, wherein said thermal anneal is performed at a temperature about 800 to 1100 degrees centigrade.

14. The method of claim 1, wherein said thermal anneal is performed in an ambient containing N$_2$, O$_2$.

15. The method of claim 1, wherein said thermal anneal is performed in an ambient containing N$_2$O.

16. The method of claim 1, wherein said spacers comprise oxide spacers.

* * * * *